United States Patent
Deepak et al.

(10) Patent No.: US 11,702,744 B2
(45) Date of Patent: Jul. 18, 2023

(54) METAL OXYFLUORIDE FILM FORMATION METHODS

(71) Applicant: Applied Materials, Inc., Santa Clara, CA (US)

(72) Inventors: Nitin Deepak, Maharashtra (IN); Gayatri Natu, Mumbai (IN); Albert Barrett Hicks, III, Sunnyvale, CA (US); Prerna Sonthalia Goradia, Mumbai (IN); Jennifer Y. Sun, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/673,345

(22) Filed: Feb. 16, 2022

(65) Prior Publication Data
US 2022/0259735 A1  Aug. 18, 2022

Related U.S. Application Data

(60) Provisional application No. 63/150,385, filed on Feb. 17, 2021.

(51) Int. Cl.
*C23C 16/455* (2006.01)
*C23C 16/30* (2006.01)

(52) U.S. Cl.
CPC ........ *C23C 16/45553* (2013.01); *C23C 16/30* (2013.01)

(58) Field of Classification Search
CPC .............. C23C 16/45553; C23C 16/30
See application file for complete search history.

(56) References Cited

U.S. PATENT DOCUMENTS

| | | | |
|---|---|---|---|
| 6,776,873 B1 | 8/2004 | Sun et al. | |
| 8,067,067 B2 | 11/2011 | Sun et al. | |
| 10,815,562 B2 | 10/2020 | Firouzdor et al. | |
| 10,847,386 B2 | 11/2020 | Sun et al. | |
| 2014/0147594 A1 | 5/2014 | Jewhurst et al. | |
| 2019/0078199 A1* | 3/2019 | Wu | C23C 16/30 |
| 2020/0283897 A1 | 9/2020 | Deepak et al. | |

FOREIGN PATENT DOCUMENTS

| | | | |
|---|---|---|---|
| JP | H08134637 A | | 5/1996 |
| JP | 2001-355070 | * | 12/2001 |
| KR | 20180132949 A | | 12/2018 |
| WO | 2010016973 A2 | | 2/2010 |

OTHER PUBLICATIONS

PCT International Search Report and Written Opinion in PCT/US2022/016682 dated Jun. 2, 2022, 10 pages.
Putkonen, Matti, et al., "Atomic layer deposition of metal fluorides through oxide chemistry", J. Mater. Chem., 2011, 21, 14461.

* cited by examiner

*Primary Examiner* — Elizabeth A Burkhart
(74) *Attorney, Agent, or Firm* — Servilla Whitney LLC

(57) ABSTRACT

Methods of forming a metal oxyfluoride films are provided. A substrate is placed in an atomic layer deposition (ALD) chamber having a processing region. Flows of zirconium-containing gas, a zirconium precursor gas, for example, Tris(dimethylamino)cyclopentadienyl zirconium, an oxygen-containing gas, a fluorine containing gas, and an yttrium precursor, for example, tris(butylcyclopentadienyl)yttrium gas are delivered to the processing region, where a metal oxyfluoride film such as an yttrium zirconium oxyfluoride film, is formed.

17 Claims, 3 Drawing Sheets

METAL OXYFLUORIDE FILM FORMATION METHODS

CROSS-REFERENCE TO RELATED APPLICATIONS

This application claims priority to U.S. Provisional Application No. 63/150,385, filed Feb. 17, 2021, the entire disclosure of which is hereby incorporated by reference herein.

TECHNICAL FIELD

Embodiments of the disclosure generally relate to methods for forming metal oxyfluoride films. In particular, embodiments of the disclosure pertain to coating components of a substrate processing chamber with a metal oxyfluoride film.

BACKGROUND

As part of the processes for manufacturing electronic devices such as semiconductor devices, flat panel display devices, and organic light emitting diode (OLED) devices in substrate processing chambers, devices are fabricated by a number of manufacturing processes producing structures of an ever-decreasing size. Some manufacturing processes such as plasma etch and plasma clean processes expose a substrate and the chamber to plasma stream. The plasma may be highly corrosive and may corrode processing chambers and other surfaces that are exposed to the plasma. Accordingly, it is often desirable to coat chamber surfaces, chamber components, and chamber tools with a fluorinated coating to protect these portions of the chamber from corrosion or degradation. Without a fluorinated coating, a plasma such as a halogenated plasma during substrate processing may corrode these portions of the substrate processing chamber. The corrosion of the chamber surfaces, chamber components, and chamber tools can have a deleterious impact on electronic devices manufactured in the substrate processing chamber, for example, negative effects on product yield, chamber uptime, and customer cost.

Current oxyfluoride film formation methods utilize materials such as HF-pyridine and fluorine that do not provide precise control of properties of the fluorinated coating. Accordingly, there is a need for improved methods of forming oxyfluoride films, and in particular, methods for forming oxyfluoride films on chamber surfaces, chamber components, and chamber tools of substrate processing chambers.

SUMMARY

One or more embodiments of the disclosure are directed to a method of forming an yttrium zirconium oxyfluoride film, the method comprising placing a substrate in an atomic layer deposition (ALD) chamber comprising a processing region; flowing a pulse of an yttrium precursor gas to the processing region; flowing alternating pulses of a fluorine precursor gas and an oxygen-containing gas to the processing region to form an yttrium-oxygen-fluorine containing layer on the substrate; flowing a pulse of a zirconium precursor gas to the processing region; and flowing alternating pulses of a fluorine precursor gas and an oxygen-containing gas to the processing region to form the yttrium zirconium oxyfluoride film on the substrate.

Another embodiment is directed to a method of forming an yttrium zirconium oxyfluoride film on a substrate, the method comprising flowing a pulse of yttrium precursor gas across the substrate, the substrate selected from the group consisting of a portion of a substrate processing chamber, a substrate processing chamber component and a substrate processing chamber surface; flowing alternating pulses of a fluorine containing gas and an oxygen-containing gas across the substrate to form an yttrium-oxygen-fluorine containing layer on the substrate; flowing a pulse of a zirconium precursor gas across the substrate; and flowing alternating pulses of a fluorine containing gas and an oxygen-containing gas across the substrate to form the yttrium zirconium oxyfluoride film on the substrate.

Another embodiment is directed to a method of forming an yttrium zirconium oxyfluoride film on a substrate, the method comprising flowing a pulse of $Y(CpBut)_3$ gas across the substrate, the substrate selected from the group consisting of a portion of a substrate processing chamber, a substrate processing chamber component and a substrate processing chamber surface; flowing alternating pulses of a hexafluoroacetylacetonate gas and an oxygen-containing gas across the substrate to form an yttrium-oxygen-fluorine containing layer on the substrate; flowing a pulse of Tris(dimethylamino)cyclopentadienyl zirconium $(CpZr(NMe_2)_3)$ gas across the substrate; and flowing alternating pulses of a $NF_3$ gas and an oxygen-containing gas across the substrate to form the yttrium zirconium oxyfluoride film on the substrate.

DETAILED DESCRIPTION

Figure 1:
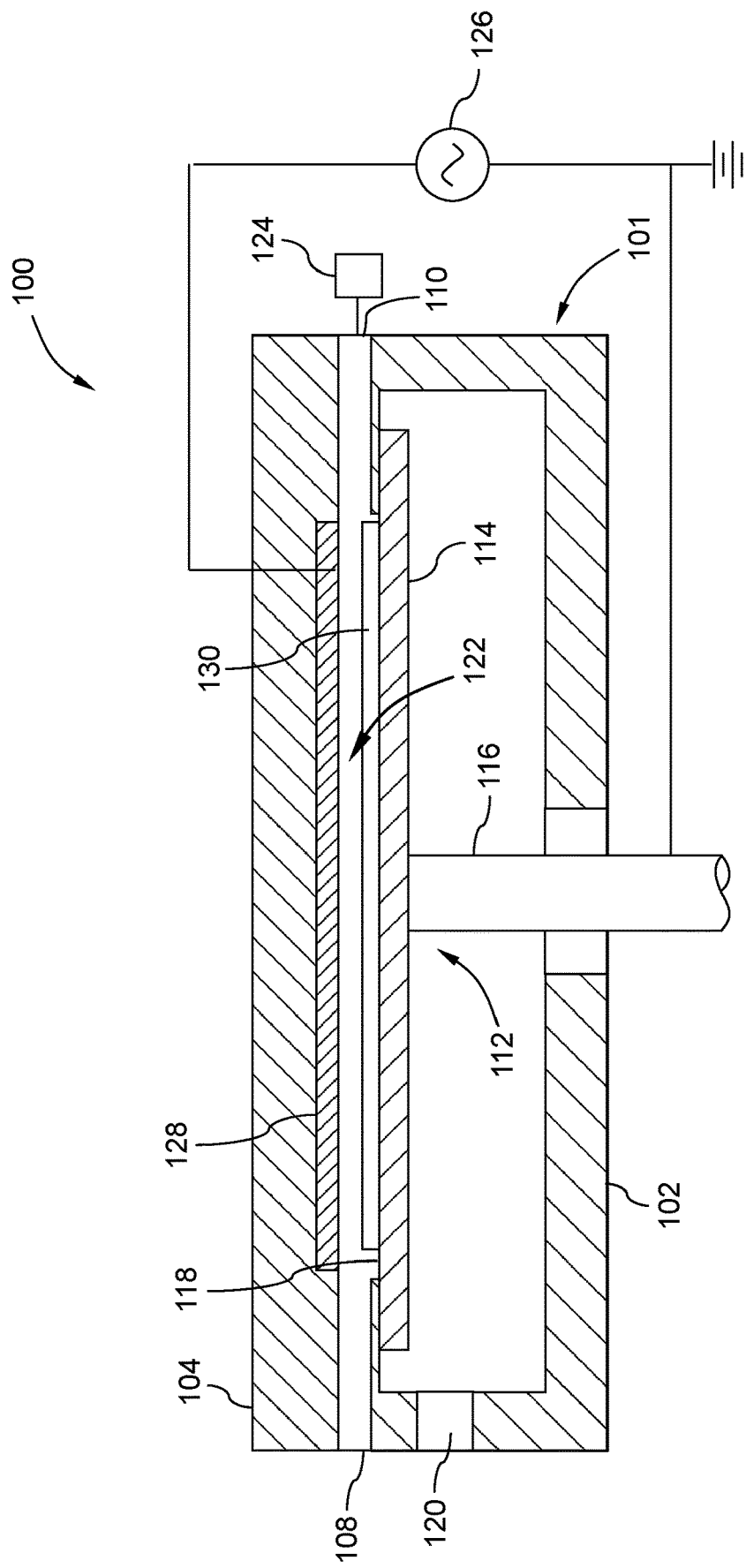
FIG. 1 is a schematic view of an atomic layer deposition chamber according to an embodiment.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

In addition to forming film directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. In specific embodiments, the substrate comprises a portion of a substrate processing chamber, a substrate processing chamber component or a substrate processing chamber surface. In some specific embodiments, the substrate processing chamber, substrate processing chamber component or substrate processing chamber surface comprises aluminum, an aluminum alloy and/or an anodized aluminum alloy. The term "on" indicates that there is direct contact between elements. The term "directly on" indicates that there is direct contact between elements with no intervening elements.

One or more embodiments of the disclosure are directed to a method of forming a fluorinated metal film and a method of forming a metal oxyfluoride film. It has been determined that a controllable self-limiting fluorination method can be achieved according to one or more embodiments of the methods described herein. Some embodiments comprise an atomic layer deposition (ALD) process. In some embodiments, Y to Zr and O to F ratios can be precisely tuned or adjusted very easily. One or more embodiments of the method described herein provide a much easier method of using hexafluoroacetylacetonate (HHFAC) with oxygen or ozone plasmas for fluorination and using $NF_3$ on its own for fluorination to form metal oxyfluoride films. It has been determined that embodiments of the fluorination methods described herein can achieve atomic scale fluorination control that was not previously believed to be possible by other methods. One or more embodiments of the methods described herein method provide an easier method of fluorinating metals (e.g., Y and Zr) and metal oxides (e.g., YO and ZrO) compared to conventional fluorination methods such as methods that utilize HF-pyridine and fluorine. In one or more embodiments, the metal oxyfluoride film is amorphous. In other embodiments, the metal oxyfluoride film is crystalline. In some embodiments, the metal oxyfluoride film comprises a partially amorphous and partially crystalline film.

Embodiments of the methods described herein can be used to control the oxygen to fluorine ratio in oxyfluoride compounds with atomic precision. Embodiments of the methods of fluorination are self-limiting, which provide greater control than thermal fluorination methods.

In specific embodiments, yttrium zirconium oxyfluoride films are formed on a substrate surface, in particular a portion of a substrate processing chamber. Embodiments of the method include depositing a metal-oxide containing layer on a substrate using an atomic layer deposition (ALD) process, depositing a metal-fluorine layer on the metal-oxide containing layer using an activated fluorination process, and repeating depositing the metal-oxide containing layer and depositing the metal-oxide containing layer until a metal oxyfluoride film with a predetermined film thickness is formed.

FIG. 1 is a schematic view of an atomic layer deposition (ALD) chamber 100. It is to be understood that the chamber described in this disclosure is an exemplary embodiment of a chamber and other chambers, including chambers from other manufacturers, may be used with or modified to accomplish aspects of the present disclosure, such a method 200 of forming a metal oxyfluoride film 300.

The ALD chamber 100 includes a chamber body 101. The chamber body includes a body portion 102, and a lid portion 104, and a support assembly 112. A gas inlet 108 and a gas outlet 110 disposed between the body portion 102 and lid portion 104 of the chamber body 101. The support assembly 112 is at least partially disposed within the body portion 102 of the chamber body 101. The support assembly 106 includes a pedestal 114 movably disposed in the chamber body 101 by a stem 116. The pedestal 114 includes a support surface 118 configured to support a substrate 130, described in further detail herein. The stem 116 extends through the chamber body 101 and is connected to a lift system (not shown) that moves the pedestal 114 between a processing position (as shown) and a transfer position. The transfer position facilitates transfer of the substrate 130 through an opening 120 formed in a sidewall of the body portion 102 to provide access to the interior of the ALD chamber 100.

In the processing position, the pedestal 114 of the support assembly 112 contacts the body portion 102 to form a processing region 122 defined by the support surface 118, an upper surface of the body portion 102, and a lower surface of the lid portion 104. When the support assembly 112 in the processing position contacts the body portion 102 to form a processing region 122, the gas inlet 108 and the gas outlet 110 are in fluid communication with the processing region 122. In this manner, gas is provided to the processing region 122 through the gas inlet 108. The substrate 130 is adjacent the processing region 122. Gas flows in the processing region 122 across the substrate 130 and is exhausted through the gas outlet 110 by a pump 124. A source, for example, a plasma source 126 (e.g., a radio frequency (RF) source or a microwave source), is coupled to an electrode 128 of the lid portion 104. The plasma source 126 in some embodiments comprises a microwave source or a combined RF source and microwave source. The plasma source 126 powers the electrode 128 to facilitate generation of plasma from gas in the processing region 122. The pedestal 114 is grounded or the pedestal 114 may serve as a cathode when connected to the plasma source 126 to generate a capacitive electric field between the lower surface of the lid portion 104 and the pedestal 114 to accelerate plasma species toward the substrate 130.

Figure 2:
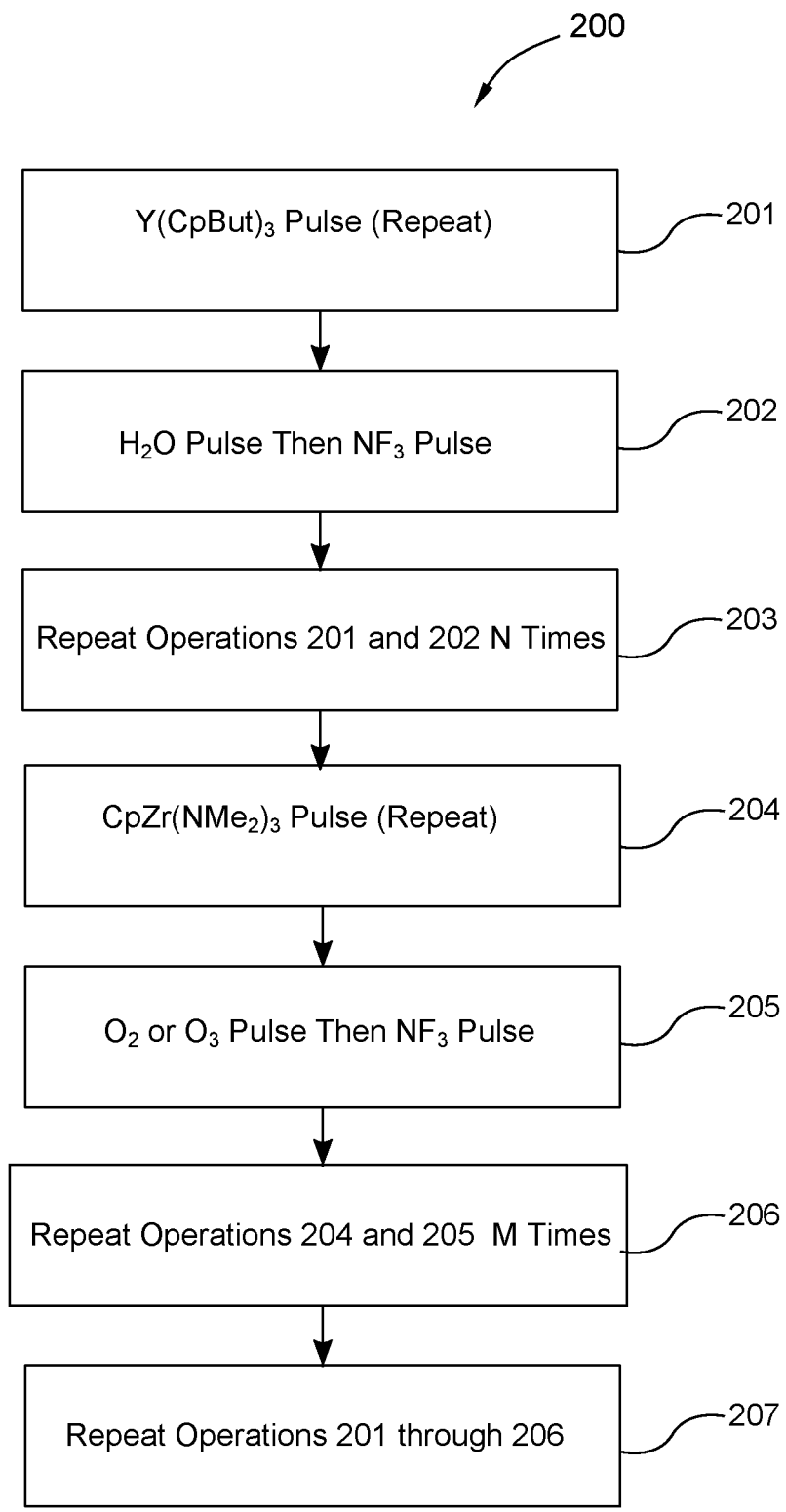
FIG. 2 is a flow diagram illustrating operations of a method of forming a metal oxyfluoride film according to a specific, non-limiting embodiment.

FIG. 2 is a flow diagram illustrating operations of a method 200 of forming a metal oxyfluoride film on the substrate according to specific, non-limiting embodiment showing specific precursors. In particular embodiments, the metal oxyfluoride film is an yttrium zirconium oxyfluoride (YZrOF) film. At operation 201, a pulse of an yttrium precursor, e.g., tris(butylcyclopentadienyl)yttrium (Y(Cp-But)$_3$) precursor, is flowed into the ALD chamber 100. In one or more embodiments, other suitable yttrium precursors comprises a complex with a general formula $YR_1R_2R_3$, where $R_1$, $R_2$ and $R_3$ are independently selected from halides, carbonyl, cyclopentadienes, amines, acac, hfac, amidinates or diazadienes. Other non-limiting examples of yttrium precursors include Tris(N,N"-di-i-propylformamidinato)yttrium(III), Tris(ethylcyclopentadienyl)yttrium, Tris[N,N-bis(trimethylsilyl)amide]yttrium(III), Tris[N,N-bis(trimethylsily)amide]yttrium(III), Tris(butylcyclopentadienyl)yttrium, Tris(cyclopentadienyl)yttrium, Tris(methylcyclopentadienyl)yttrium, Tris(n-propylcyclopentadienyl)yttrium, Tris(2,2,6,6-tetramethyl-3,5-heptanedionato)yttrium(III), Tris(2,2,6,6-tetramethyl-3,5-heptanedionato)yttrium(III) triglyme adduct, Yttrium(III) acetylacetonate hydrate, Yttrium(III) chloride and Yttrium (III) hexafluoroacetylacetonate. The substrate 130 may be a chamber component, chamber tool, chamber, and chamber mainframe. The substrate may be comprised of aluminum and/or anodized aluminum. The method 200 of some embodiments includes transferring the substrate into the ALD chamber 100 and placing the substrate on the pedestal 114.

In one embodiment, which can be combined with other embodiments described herein, the method includes introducing a flow or pulse of an yttrium precursor, for example, tris(butylcyclopentadienyl)yttrium gas, to the processing region 122. The tris(butylcyclopentadienyl)yttrium gas is introduced as flowing gas or a pulse of gas through the gas inlet 108 and across the processing region 122, which flows across the substrate 130 and forms an yttrium-containing layer on the substrate 130. Next, a flow or a pulse of an oxygen-containing gas is introduced as flowing gas or a pulse of gas through the gas inlet 108 and across processing region 122, which flows across the substrate. In one embodiment, which can be combined with other embodiments described herein, the oxygen-containing gas includes one or more of $H_2O$, $O_3$ or $O_2$. In specific embodiments, the oxygen-containing gas comprises $H_2O$. In other embodiments, the oxygen-containing gas comprises $O_3$ or $O_2$. In operation 202, after the oxygen-containing gas is flowed across the substrate 130, a fluorine precursor, e.g., $NF_3$ gas, is introduced as flowing gas or a pulse of gas through the gas inlet 108 and across the processing region 122, which flows across the substrate 130 and forms an yttrium-oxygen-fluorine containing layer on the substrate 130. In some embodiments, the fluorine precursor includes at least one organofluorine reagent. In one or more embodiments, the fluorine precursor is selected from hexafluoroacetylacetone, pivaloyltrifluoroacetone, trifluoroacetylacetone, valeryltrifluoracetone, benzoyltrifluoroacetone, tetrafluoropropanol (TFP), 1,1,1,2-tetrafluoroethane (HFC-134) and HF-pyridine. In embodiments, which can be combined with other embodiments described herein, the fluorine precursor includes at least one fluorinated gas. Examples of fluorinated gases include, but are not limited to, at least one of gaseous HF, nitrogen trifluoride ($NF_3$), phosphorus pentafluoride ($PF_5$), or sulfur hexafluoride ($SF_6$).

In some embodiments at operations 201 and 202, the tris(butylcyclopentadienyl)yttrium gas is pulsed at least once, and in some embodiments, more than once (e.g., 2-5 times), followed by an oxygen-containing gas pulse, and then a $NF_3$ gas pulse. This pulse sequence is repeated N times at step 203 to provide an adjusted and precisely controlled yttrium fluoride concentration in the film. In one or more embodiments, N is an integer in a range from 1 to 100, 1 to 50, 1 to 30, 1 to 20, 1 to 10, 1 to 5, 1 to 4, 1 to 3, or 1 to 2.

At operations 204 and 205, a second set of gas flows or gas pulses is provided to the processing region 122. At operation 204, a flow or a pulse of a zirconium precursor gas, for example, Tris(dimethylamino)cyclopentadienyl zirconium (CpZr(NMe$_2$)$_3$) is introduced as flowing gas or a pulse of gas through the gas inlet 108 and across the processing region 122, which flows across the substrate 130. At operation 205, a flow or pulse of an oxygen-containing gas is then introduced as flowing gas or a pulse of gas through the gas inlet 108 and across processing region 122, which flows across the substrate. In one embodiment, which can be combined with other embodiments described herein, the oxygen-containing gas includes one or more of $H_2O$, $O_3$ or $O_2$. In specific embodiments, the oxygen-containing gas comprises $H_2O$. In other embodiments, the oxygen-containing gas comprises $O_3$ or $O_2$.

In some embodiments, the second set of gas pulses comprises at least one pulse of Tris(dimethylamino)cyclopentadienyl zirconium (CpZr(NMe$_2$)$_3$), followed by a pulse of $O_3$ or $O_2$, and then a pulse of $NF_3$. This second set of pulses according to one or more embodiments can be repeated M number of times depending on the desired zirconium fluoride concentration in the YZrOF film. In one or more embodiments, M is an integer in a range from 1 to 100, 1 to 50, 1 to 30, 1 to 20, 1 to 10, 1 to 5, 1 to 4, 1 to 3, or 1 to 2. At operation 307, operations 301 through 306 are repeated a sufficient number of times until a metal oxyfluoride film having a predetermined or target film thickness is formed on the substrate 130.

In specific embodiments of method 300 in which the gases comprise a first set of gas pulses and a second set of gas pulses, the range of pulse times is in a range from three milli-seconds to 60 minutes, from three milli-seconds to 50 minutes, from three milli-seconds to 40 minutes, from three milli-seconds to 30, minutes, from three milli-seconds to 20 minutes, to 10 minutes, from three milli-seconds to 5 minutes, from three milli-seconds to 3 minutes, from three milli-seconds to 2 minutes, from three milli-seconds to 1 minute, from three milli-seconds to 50 seconds, from three milli-seconds to 40 seconds, from three milli-seconds to 30 seconds, from three milli-seconds to 20 seconds, from three milli-seconds to 10 seconds or from three milli-seconds to 5 seconds, depending on the surface-area of the substrate that is coated. In one or more embodiments, the oxygen-containing precursor flowing across the processing region 122 flows across the substrate 130 and is activated into a plasma to form oxygen radicals. In another embodiment, which can be combined with other embodiments described herein, the oxygen radicals may be formed in a remote plasma source that provides the oxygen radicals to the processing region 122. In the embodiments where the oxygen radicals are formed, the oxygen radicals react with and deposit a layer of oxygen on the substrate 130. According to one or more embodiments, film growth occurs through self-limiting and saturating chemical reactions of the gaseous precursors on a substrate 130 surface. The gaseous precursors are introduced on the substrate alternately and separated by inert gas (e.g., nitrogen) purging. In one or more embodiments, introducing a flow of a purge gas to the processing region 122 is conducted in a range from about 1 milliseconds to about 1000 seconds to purge the processing region 122.

According to one or more embodiments, the number of times each of the first set of gas pulses is repeated N times at operation 203 and the second set of gas pulses is repeated M times at operation 206 control a predetermined or target Y to Zr ratio. In the embodiments shown, yttrium precursor (e.g., Y(CpBut)$_3$) pulses or zirconium precursor (e.g.,) Tris(dimethylamino)cyclopentadienyl zirconium (CpZr(NMe$_2$)$_3$) pulses may be flowed before flowing an oxidizer pulse ($H_2O$, $O_2$ or $O_3$. In one or more embodiments, the number of pulses of the yttrium and zirconium precursors before flowing an oxidizer pulse ($H_2O$, $O_2$ or $O_3$) are adjusted to obtain improved nucleation on the surface of the substrate 130. However, the present disclosure is not limited to a particular number of pulses of each gas, and in some embodiments, one yttrium precursor (e.g., Y(CpBut)$_3$) pulse and one zirconium precursor (e.g., Tris(dimethylamino) cyclopentadienyl zirconium (CpZr(NMe$_2$)$_3$) pulse may be utilized. According to one or more embodiments, other suitable precursors include Tetrakis(ethylmethylamino)zirconium (IV), Tetrakis(ethylmethylamino)zirconium (IV), Tetrakis(dimethylamino)zirconium(IV), Tetrakis(dimethylamino)zirconium(IV), Tetrakis(dimethylamino)zirconium (IV), Tetrakis(diethylamino)zirconium, Dimethylbis(t-butylcyclopentadienyl)zirconium, Bis(pentamethylcyclopentadienyl)dimethylzirconium (IV), Bis(cyclopentadienyl)dimethylzirconium, Bis(methylcyclopentadienyl) (methyl)(methoxy)zirconium (IV), and Tetrakis(dimethylamino)zirconium(IV).

Figure 3:
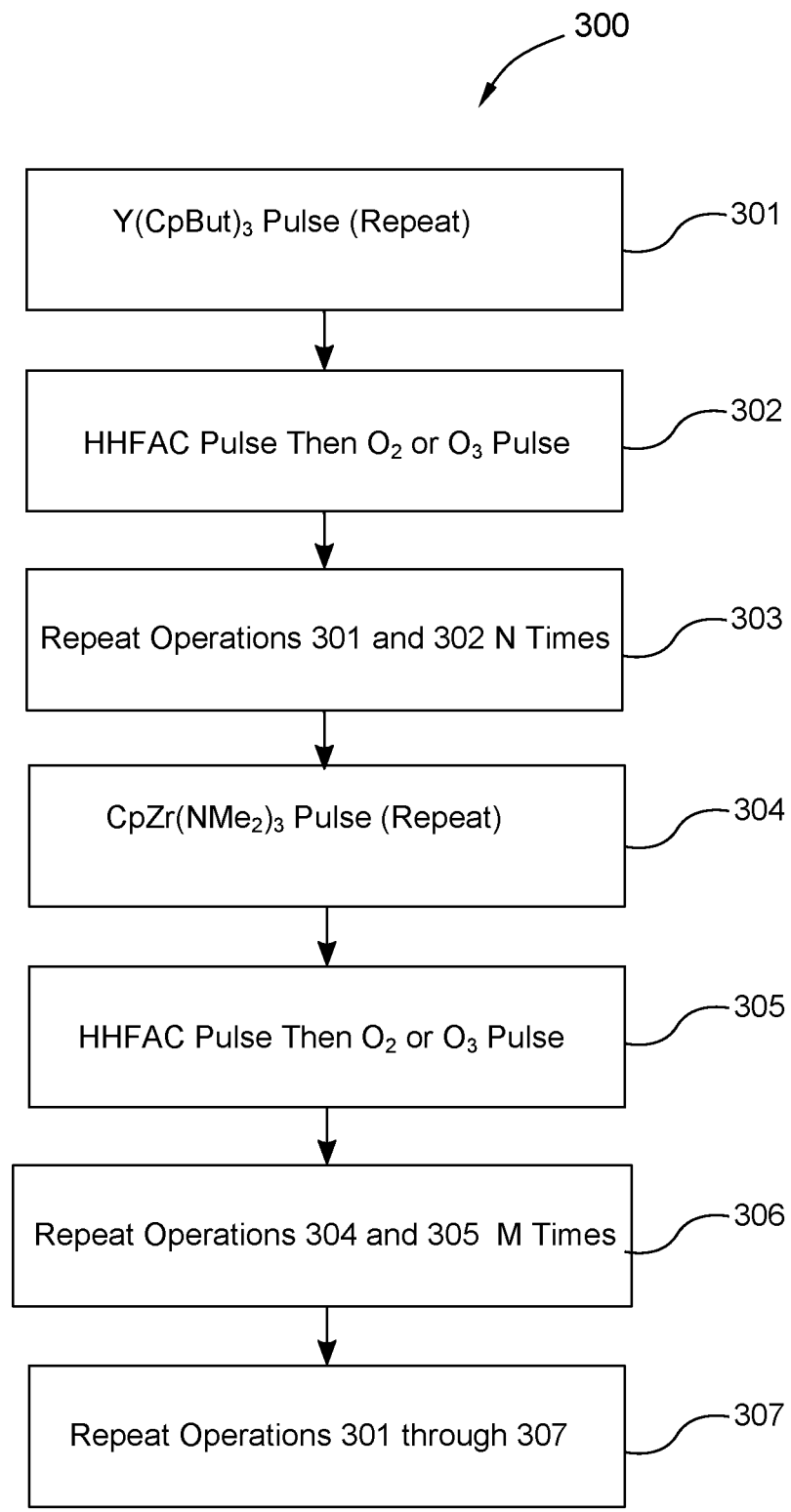
FIG. 3 is a flow diagram illustrating operations of a method of forming a metal oxyfluoride film according to a specific, non-limiting embodiment.

Referring now to FIG. 3, another embodiment of forming a metal oxyfluoride film on a substrate 130 is shown, according to specific, non-limiting embodiment showing specific precursors. In particular embodiments, the metal oxyfluoride film is an yttrium zirconium oxyfluoride (YZrOF) film. At operation 301, a pulse of tris(butylcyclopentadienyl)yttrium (Y(CpBut)$_3$) precursor is flowed into the ALD chamber 100. The substrate 130 may be a chamber component, chamber tool, chamber, and chamber mainframe. The substrate may be comprised of aluminum and/or anodized aluminum. The method 200 of some embodiments includes transferring the substrate into the ALD chamber 100 and placing the substrate on the pedestal 114.

In one embodiment, which can be combined with other embodiments described herein, the method includes introducing a flow or pulse of an yttrium precursor, for example, tris(butylcyclopentadienyl)yttrium gas, to the processing region 122. The tris(butylcyclopentadienyl)yttrium gas is introduced as flowing gas or a pulse of gas through the gas inlet 108 and across the processing region 122, which flows across the substrate 130 and forms an yttrium-containing layer on the substrate 130. According to one or more embodiments, other suitable precursors include Tetrakis(ethylmethylamino)zirconium (IV), Tetrakis(ethylmethylamino)zirconium (IV), Tetrakis(dimethylamino)zirconium (IV), Tetrakis(dimethylamino)zirconium(IV), Tetrakis(dimethylamino)zirconium(IV), Tetrakis(diethylamino)zirconium, Dimethylbis(t-butylcyclopentadienyl)zirconium, Bis(pentamethylcyclopentadienyl)dimethylzirconium (IV), Bis(cyclopentadienyl)dimethylzirconium, Bis(methylcyclopentadienyl) (methyl)(methoxy)zirconium (IV), and Tetrakis(dimethylamino)zirconium(IV).

Next, a flow or a pulse of an oxygen-containing gas is introduced as flowing gas or a pulse of gas through the gas inlet 108 and across processing region 122, which flows across the substrate. In one embodiment, which can be combined with other embodiments described herein, the oxygen-containing gas includes one or more of $H_2O$, $O_3$ or $O_2$. In specific embodiments, the oxygen-containing gas comprises $H_2O$. In other embodiments, the oxygen-containing gas comprises $O_3$ or $O_2$. In operation 302, after the oxygen-containing gas is flowed across the substrate 130, a fluorine precursor, e.g., hexafluoroacetylacetonate (HHFAC) gas, is introduced as flowing gas or a pulse of gas through the gas inlet 108 and across the processing region 122, which flows across the substrate 130 and forms an yttrium-oxygen-fluorine containing layer on the substrate 130.

In some embodiments at operations 301 and 302, the tris(butylcyclopentadienyl)yttrium gas is pulsed, followed by one oxygen-containing gas pulse, and then a single HHFAC pulse. This pulse sequence is repeated N times at step 303 to provide an adjusted and precisely controlled yttrium fluoride concentration in the film. In one or more embodiments, N is an integer in a range from 1 to 100, 1 to 50, 1 to 30, 1 to 20, 1 to 10, 1 to 5, 1 to 4, 1 to 3, or 1 to 2.

At operations 304 and 305, a second set of gas flows or gas pulses is provided to the processing region 122. At operation 304, a flow or a pulse of a zirconium precursor gas, for example, Tris(dimethylamino)cyclopentadienyl zirconium (CpZr(NMe$_2$)$_3$) is introduced as flowing gas or a pulse of gas through the gas inlet 108 and across the processing region 122, which flows across the substrate 130. At operation 305, a flow or pulse of an oxygen-containing gas is introduced as flowing gas or a pulse of gas through the gas inlet 108 and across processing region 122, which flows across the substrate. In one embodiment, which can be combined with other embodiments described herein, the oxygen-containing gas includes one or more of $H_2O$, $O_3$ or $O_2$. In specific embodiments, the oxygen-containing gas comprises $H_2O$. In other embodiments, the oxygen-containing gas comprises $O_3$ or $O_2$.

In some embodiments, the second set of gas pulses comprises at least one pulse of a zirconium precursor (e.g., Tris(dimethylamino)cyclopentadienyl zirconium (CpZr(NMe$_2$)$_3$) followed by a single pulse of $O_3$ or $O_2$, and then a single pulse of a fluorine precursor (e.g., HHFAC). This second set of pulses according to one or more embodiments can be repeated M number of times depending on the desired zirconium fluoride concentration in the YZrOF film. According to one or more embodiments, other suitable precursors include Tetrakis(ethylmethylamino)zirconium(IV), Tetrakis(ethylmethylamino)zirconium(IV), Tetrakis(dimethylamino)zirconium(IV), Tetrakis(dimethylamino)zirconium (IV), Tetrakis(dimethylamino)zirconium(IV), Tetrakis(diethylamino)zirconium, Dimethylbis(t-butylcyclopentadienyl)zirconium, Bis(pentamethylcyclopentadienyl)dimethylzirconium (IV), Bis(cyclopentadienyl)dimethylzirconium, Bis(methylcyclopentadienyl) (methyl)(methoxy)zirconium (IV), and Tetrakis(dimethylamino)zirconium(IV). In one or more embodiments, M is an integer in a range from 1 to 100, 1 to 50, 1 to 30, 1 to 20, 1 to 10, 1 to 5, 1 to 4, 1 to 3, or 1 to 2. At operation 207, operations 201 through 206 are repeated a sufficient number of times until a metal oxyfluoride fil, for example, an yttrium zirconium oxyfluoride film, having a predetermined or target film thickness is formed on the substrate 130.

In specific embodiments of method 200 in which the gases comprise a first set of gas pulses and a second set of gas pulses, the range of pulse times is in a range from three milli-seconds to 60 minutes, from three milli-seconds to 50 minutes, from three milli-seconds to 40 minutes, from three milli-seconds to 30, minutes, from three milli-seconds to 20 minutes, from three milli-seconds to 10 minutes, from three milli-seconds to 5 minutes, from three milli-seconds to 3 minutes, from three milli-seconds to 2 minutes, from three milli-seconds to 1 minute, from three milli-seconds to 50 seconds, from three milli-seconds to 40 seconds, from three milli-seconds to 30 seconds, from three milli-seconds to 20 seconds, from three milli-seconds to 10 seconds or from three milli-seconds to 5 seconds, depending on the surface-area of the substrate that is coated. In one or more embodiments, the oxygen-containing precursor flowing across the processing region 122 flows across the substrate 130 and is activated into a plasma to form oxygen radicals. In another embodiment, which can be combined with other embodiments described herein, the oxygen radicals may be formed in a remote plasma source that provides the oxygen radicals to the processing region 122. In the embodiments where the oxygen radicals are formed, the oxygen radicals react with and deposit a layer of oxygen on the substrate 130. According to one or more embodiments, film growth occurs through self-limiting and saturating chemical reactions of the gaseous precursors on a substrate 130 surface. The gaseous precursors are introduced on the substrate alternately and separated by inert gas (e.g., nitrogen) purging. In one or more embodiments, introducing a flow of a purge gas to the processing region 122 is conducted in a range from about 1 milliseconds to about 1000 seconds to purge the processing region 122.

According to one or more embodiments, the number of times each of the first set of gas pulses is repeated N times at operation 303 and the second set of gas pulses is repeated M times at operation 306 control a predetermined or target Y to Zr ratio. In the embodiments shown, at least one yttrium precursor (e.g., Y(CpBut)$_3$) pulse or at least one zirconium precursor (e.g., Tris(dimethylamino)cyclopentadienyl zirconium (CpZr(NMe$_2$)$_3$) pulses before flowing an oxidizer pulse (H$_2$O, O$_2$ or O$_3$) are adjusted to obtain improved nucleation on the surface of the substrate 130. However, the present disclosure is not limited to a particular number of pulses of each gas, and in some embodiments, one Y(CpBut)$_3$ pulse and one Tris(dimethylamino)cyclopentadienyl zirconium (CpZr(NMe$_2$)$_3$) pulse maybe be utilized.

According to one or more embodiments, controlling the O:F ratio and the atomic percentage of oxygen provide the ability to tune the corrosion resistance and application of the metal oxyfluoride film. In some embodiments, the O:F ratio is in a range from 1:100 to 100:1, for example, less than 1:1, such as less than 1:6. In some embodiments, the atomic percentage of oxygen is 1-98%, for example, 1-90%, 1-80%, 1-70%, 1-60%, 1-50%, 1-40%, 1-30%, 1-20%, or 1-0%. In one embodiment, the film has an atomic percentage of oxygen, such that the metal oxyfluoride film comprises 0.01-5% oxygen content, i.e., the atomic percentage of oxygen of the metal oxyfluoride film 1-5%. In another embodiment, the metal oxyfluoride film comprises 0.01-2% oxygen content, i.e., the atomic percentage of oxygen of the metal oxyfluoride film is 0.01-2%. In one or more embodiments, the atomic percentage of fluorine is from 1-99%, for example the atomic percentage of fluorine is from 1-98%, for example, 1-90%, 1-80%, 1-70%, 1-60%, 1-50%, 1-40%, 1-30%, 1-20%, 1-0%. In one embodiment, the film has an atomic percentage of fluorine, such that the metal oxyfluoride film comprises 0.01-5% fluorine content, i.e., the atomic percentage of fluorine of the metal oxyfluoride film 1-5%. In another embodiment, the metal oxyfluoride film comprises 0.01-2% fluorine content, i.e., the atomic percentage of fluorine of the metal oxyfluoride film is 0.01-2%.

In one or more embodiments a temperature in the processing region 122 is in a range from about 150° C. to 500° C. and a pressure in the processing region 122 is in a range from about 0.01 mbar to 100 mbar during the method 200 or the method 300. In one embodiment, the temperature in the processing region 122 controls the O:F ratio and the atomic percentage of oxygen.

The utilization of the exemplary embodiments of the methods described herein provide for precise atomic control of the metal oxyfluoride film. According to embodiments of the method 300, HHFAC replaces Y(CpBut)$_3$ ligands at the surface of the substrate with fluorinated acetyl acetonate (ACAC) groups. Pulses of the oxygen gas, for example, O$_3$, after HHFAC, creates fluorinating species such as HF in-situ, which promotes fluorination of the film. A similar phenomenon occurs for alternating pulses of Tris(dimethylamino)cyclopentadienyl Zirconium (CpZr(NMe$_2$)$_3$), HHFAC, and the oxygen precursor (e.g., O$_3$). In embodiments that utilize HHFAC, the oxygen precursor (e.g., O$_3$) functions as an activator. It has been determined that use of HHFAC increases fluorine in films as compared to films formed using NF$_3$.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming an yttrium zirconium oxyfluoride film, the method comprising:
    placing a substrate in an atomic layer deposition (ALD) chamber comprising a processing region;
    flowing a pulse of Y(CpBut)$_3$ gas to the processing region;
    flowing alternating pulses of a hexafluoroacetylacetonate gas and an oxygen-containing gas to the processing region to form an yttrium-oxygen-fluorine containing layer on the substrate;
    flowing a pulse of a zirconium precursor gas to the processing region; and
    flowing alternating pulses of a fluorine precursor gas and an oxygen-containing gas to the processing region to form the yttrium zirconium oxyfluoride film on the substrate.

2. The method of claim 1, wherein the substrate is selected from the group consisting of a portion of a substrate processing chamber, a substrate processing chamber component and a substrate processing chamber surface.

3. The method of claim 1, wherein the zirconium precursor gas comprises Tris(dimethylamino)cyclopentadienyl zirconium (CpZr(NMe$_2$)$_3$).

4. The method of claim 1, wherein the zirconium precursor gas comprises Tris(dimethylamino)cyclopentadienyl zirconium (CpZr(NMe$_2$)$_3$).

5. The method of claim 1, further comprising repeating each of the pulses of the Y(CpBut)$_3$ gas, the hexafluoroacetylacetonate gas, the oxygen-containing gas, the fluorine precursor gas and the zirconium precursor gas until a predetermined film thickness is formed.

6. The method of claim 5, wherein a ratio of the pulses of the Y(CpBut)$_3$ gas and the pulses of the zirconium precursor gas is in a range from 1:100 to 100:1.

7. The method of claim 5, wherein each the pulses of the Y(CpBut)$_3$ gas, the hexafluoroacetylacetonate gas, the oxygen-containing gas, the fluorine precursor gas and the zirconium precursor gas is in a range from three milli-seconds to 60 minutes.

8. The method of claim 7, further comprising flowing an inert purge gas after flowing each of the pulses of the Y(CpBut)$_3$ gas, the hexafluoroacetylacetonate gas, the oxygen-containing gas, the fluorine precursor gas and the zirconium precursor gas.

9. The method of claim 1, wherein each the pulses of the Y(CpBut)$_3$ gas, the hexafluoroacetylacetonate gas, the oxygen-containing gas, the fluorine precursor gas, and the zirconium precursor gas is in a range from three milli-seconds to 60 minutes.

10. The method of claim 9, further comprising flowing an inert purge gas after flowing each of the pulses of the Y(CpBut)$_3$ gas, the hexafluoroacetylacetonate gas, the oxygen-containing gas, the fluorine precursor gas and the zirconium precursor gas.

11. The method of claim 1, wherein the processing region is at a temperature range from 150° C. to 500° C. and the processing region is at pressure in a range from 0.01 mbar to 100 mbar.

12. A method of forming an yttrium zirconium oxyfluoride film on a substrate, the method comprising:
flowing a pulse of Y(CpBut)$_3$ gas across the substrate, the substrate selected from the group consisting of a portion of a substrate processing chamber, a substrate processing chamber component and a substrate processing chamber surface;
flowing alternating pulses of hexafluoroacetylacetonate gas and an oxygen-containing gas across the substrate to form an yttrium-oxygen-fluorine containing layer on the substrate;
flowing a pulse of a zirconium precursor gas across the substrate; and
flowing alternating pulses of a fluorine containing gas and an oxygen-containing gas across the substrate to form the yttrium zirconium oxyfluoride film on the substrate.

13. The method of claim 12, further comprising repeating each of the pulses of the Y(CpBut)$_3$ gas, the hexafluoroacetylacetonate gas, the oxygen-containing gas, the fluorine-containing gas and the zirconium precursor gas until a predetermined film thickness is formed.

14. The method of claim 13, wherein a ratio of the pulses of the Y(CpBut)$_3$ gas and the pulses of the zirconium precursor gas is in a range from 1:100 to 100:1.

15. A method of forming an yttrium zirconium oxyfluoride film on a substrate, the method comprising:
flowing a pulse of Y(CpBut)$_3$ gas across the substrate, the substrate selected from the group consisting of a portion of a substrate processing chamber, a substrate processing chamber component and a substrate processing chamber surface;
flowing alternating pulses of a hexafluoroacetylacetonate gas and an oxygen-containing gas across the substrate to form an yttrium-oxygen-fluorine containing layer on the substrate;
flowing a pulse of Tris(dimethylamino)cyclopentadienyl zirconium (CpZr(NMe$_2$)$_3$) gas across the substrate; and
flowing alternating pulses of a fluorine-containing gas and an oxygen-containing gas across the substrate to form the yttrium zirconium oxyfluoride film on the substrate.

16. The method of claim 15, further comprising repeating each of the pulses of the Y(CpBut)$_3$ gas, the hexafluoroacetylacetonate gas, the oxygen-containing gas, the fluorine-containing gas and the Tris(dimethylamino)cyclopentadienyl zirconium (CpZr(NMe$_2$)$_3$) gas until a predetermined film thickness is formed.

17. The method of claim 16, wherein a ratio of the pulses of the Y(CpBut)$_3$ gas and the pulses of the Tris(dimethylamino)cyclopentadienyl zirconium (CpZr(NMe$_2$)$_3$) gas is in a range from 1:100 to 100:1.

* * * * *